US006897913B2

(12) United States Patent
Tsuboyama et al.

(10) Patent No.: US 6,897,913 B2
(45) Date of Patent: May 24, 2005

(54) LUMINESCENCE DEVICE

(75) Inventors: Akira Tsuboyama, Sagamihara (JP); Shinjiro Okada, Isehara (JP); Takao Takiguchi, Tokyo (JP); Takashi Moriyama, Kawasaki (JP); Jun Kamatani, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/904,505

(22) Filed: Jul. 16, 2001

(65) Prior Publication Data

US 2002/0038860 A1 Apr. 4, 2002

(30) Foreign Application Priority Data

Jul. 19, 2000 (JP) ........................................ 2000/218321

(51) Int. Cl.⁷ ............................................ G02F 1/1335
(52) U.S. Cl. ........................... 349/61; 349/69; 313/506; 313/505
(58) Field of Search ...................... 349/61, 69, 70, 349/71, 76, 164, 182, 184, 193; 313/506, 505

(56) References Cited

U.S. PATENT DOCUMENTS

| | | | | |
|---|---|---|---|---|
| 3,775,631 A | * | 11/1973 | Morikawa | 313/108 A |
| 3,844,637 A | * | 10/1974 | Masi | 350/160 LC |
| 4,416,515 A | * | 11/1983 | Funada et al. | 350/350 F |
| 4,556,287 A | | 12/1985 | Funada et al. | 350/336 |
| 4,943,145 A | | 7/1990 | Miyata | 350/354 |
| 5,698,858 A | | 12/1997 | Börner | 250/484.2 |
| 5,756,224 A | | 5/1998 | Börner et al. | 428/690 |
| 5,942,612 A | * | 8/1999 | McKeown et al. | 540/140 |
| 6,174,455 B1 | * | 1/2001 | Hanna et al. | 252/299.62 |
| 6,437,123 B1 | * | 8/2002 | Bock et al. | 544/216 |

FOREIGN PATENT DOCUMENTS

| | | |
|---|---|---|
| DE | 198 09 944 | 10/1998 |
| EP | 186 970 | 11/1985 |
| EP | 864 631 | 9/1998 |
| EP | 915 144 | 5/1999 |
| JP | 8-319482 | 12/1996 |
| JP | 11-256148 | 9/1999 |
| JP | 11-329739 | 11/1999 |
| JP | 068052 | 3/2000 |

OTHER PUBLICATIONS

Baldo, et al., "Very high–efficiency green organic light–emitting devices based . . . ", Applied Physics Letters, vol. 75, No. 1 (1999), pp. 4–6.

O'Brien, et al., "Improved energy transfer in electrophosphorescent devices", Applied Physics Letters, vol. 74, No. 3 (1999), pp. 442–444.

K. Kogo, et al., "Polarized Ligth Emission from a Calamitic Liquid Crystalline Semiconductor Doped with Dyes", Appl. Phys. Lett., vol. 73, No. 11, pp. 1595–1597 (1998).

Communication, European Pattern Office, Application 01 117 367.1 –1218, Ref. EP 31588, Feb. 23, 2004, 3 pages.*

* cited by examiner

Primary Examiner—Toan Ton
Assistant Examiner—Thoi V. Duong
(74) Attorney, Agent, or Firm—Fitzpatrick, Cella, Harper & Scinto

(57) ABSTRACT

A luminescence device exhibiting a better luminescence efficiency is provided by disposing between a pair of electrodes a luminescence layer comprising a mixture of a liquid crystal compound assuming discotic phase or smectic phase with a phosphorescent compound preferably having a planar molecular skeleton.

7 Claims, 2 Drawing Sheets

LUMINESCENCE DEVICE

BACKGROUND OF THE INVENTION

The present invention relates to a luminescence device for use in a display apparatus, an illumination apparatus, etc., and more particularly to a luminescence device having a high electroconductivity due to a self-alignment characteristic of a liquid crystal compound.

An organic electroluminescence device (hereinafter sometimes called an "organic EL device"), as a type of luminescence device, has been an object of extensive research and development in the search for a high speed response and high efficiency luminescence device.

FIGS. 1 and 2 are schematic sectional views, each illustrating a basic structure of an example of an organic EL device. Referring to FIGS. 1 and 2, such organic EL devices include: a transparent substrate 1, a transparent electrode 2, a metal electrode 3, organic layer(s) 4, a luminescence layer 5, a holetransporting layer 6 and an electron-transporting layer 7. Such a basic structure of an organic EL device is disclosed in, e.g., Macromol. Symp., vol. 125, pp. 1–48 (1977).

As shown in FIGS. 1 and 2, an organic EL device generally has a structure including a laminate comprising a plurality of organic layers 4 sandwiched between a transparent electrode 2 and a metal electrode 3 and disposed on a transparent substrate 1.

In the structure of FIG. 1, the organic layers 4 comprise a luminescence layer 5 and a hole-transporting layer 6. The transparent electrode 2 comprises a material, such as ITO (indium tin oxide) having a large work function, so as to ensure a good hole injection characteristic from the transparent electrode 2 to the hole-transporting layer 6. The metal electrode 3 comprises a metal material having a small work function, such as aluminum, magnesium or alloys of these, so as to ensure a good election injection characteristic to the organic layers 4. The electrodes 2 and 3 may be formed in a thickness of 50–200 nm.

The luminescence layer 5 may, for example, comprise an aluminum quinolynol complex (a representative example of which is "Alq" having a structure as shown below) showing an electron-transporting characteristic and a luminescence characteristic. The hole-transporting layer 6 may comprise a material showing an electro-donating characteristic, such as triphenyldiamine derivatives (a representative example of which is "α-NPD" having a structure as shown below):

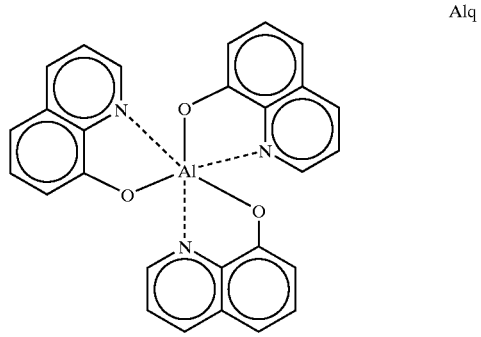

Alq

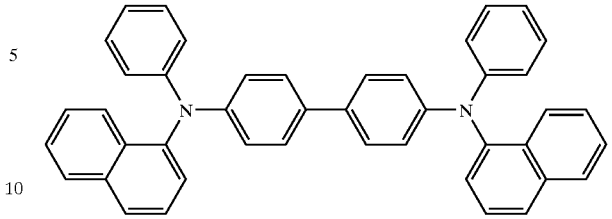

α-NPD

The organic EL device of FIG. 1 shows a rectifying characteristic, and when a voltage is applied between the metal electrode 3 as a cathode and the transparent electrode 2 as an anode, electrons are injected from the metal electrode 3 into the luminescence layer 5, and holes are injected from the transparent electrode 2. The holes and electrons injected to the luminescence layer 5 are recombined in the luminescence layer 5 to form excitons, which cause luminescence. In this instance, the hole-transporting layer 6 functions as a layer for blocking electrons to provide a higher recombination efficiency at the luminescence layer/hole-transporting layer boundary, thereby providing an enhanced luminescence efficiency.

Further, in the structure of FIG. 1, an electron-transporting layer 7 is disposed between the metal electrode 3 and the luminescence layer 5 in the structure of FIG. 1. According to this structure, the luminescence function is separated from the functions of both electron transportation and hole transportation to provide a structure exhibiting more effective carrier blocking, thus realizing more efficient luminescence. The electron-transporting layer 7 may comprise, e.g., an oxadiazole derivative.

The organic layers 4 comprise two or three organic layers and may have a thickness of 50–500 nm in total of the two or three layers.

In the above-mentioned organic EL devices, the luminescence performance is critically determined by performance of injection of electrons and/or holes from the electrodes. The above-mentioned amorphous materials, such as Alq and α-NPD are not believed to provide sufficient carrier injection performances in view of the resultant electrode-organic layer boundaries.

Further, in the course of the recent development of organic EL devices, devices utilizing phosphorescence from a triplet exciton instead of fluorescence from a single exciton have been studied. This is discussed in, e.g., the following articles:

(1) "Improved Energy Transfer in Electro-Phosphorescent Device" (D. F. O'Brien, et al., Appl. Phys. Lett., vol. 74, no. 3, p. 422 (1999)); and
(2) "Very High-Efficiency Green Organic Light-Emitting Devices Based on Electro-Phosphorescence" (M. A. Baldo, et al., Appl. Phys. Lett., vol. 75, no. 1, p. 4 (1999)).

In the above articles, a structure including organic layers 4 of four layers as shown in FIG. 3 is principally used. More specifically, the organic layers 4 sequentially include, from the anode side, a hole-transporting layer 6, a luminescence layer 5, an exciton diffusion prevention layer 9 and an electron-transporting layer. As materials constituting the organic layers 4, in addition to Alq and α-NPD mentioned above, there have been enumerated carrier-transporting materials, such as CBP (4,4'-N,N'-dicarbazole-biphenyl) and BPC (2,9-dimethyl-4,7-diphenyl-1,10-phenanthroline), and phosphorescent compounds, such as PtOEP (platinum-octaethylporphyrin complex) and Ir(ppy)$_3$ (iridium-phenylpyrimidine complex), respectively represented by the following structural formulae:

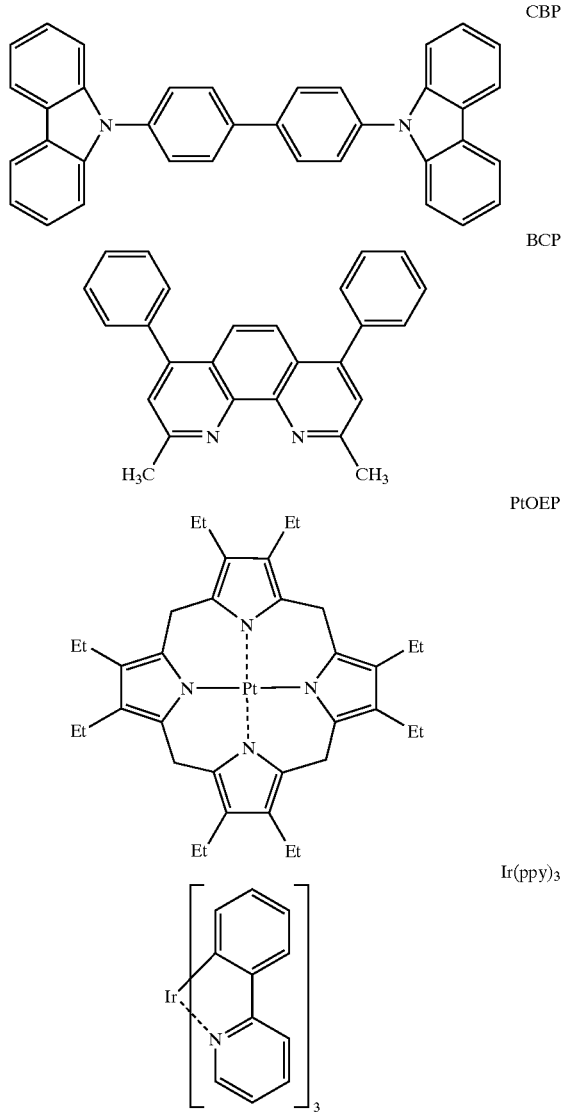

The above-mentioned articles have reported structures as exhibiting a high efficiency, including a hole-transporting layer 6 comprising α-NPD, an electron-transporting layer 7 comprising Alq, an exciton diffusion-prevention layer 9 comprising BCP, and a luminescence layer 5 comprising CBP as a host and 6 mol. % of PtOEP or 6 wt. % of Ir(ppy)$_3$ as a phosphorescent compound.

A phosphorescent compound has been particularly noted because it is expected to exhibit a high luminescence efficiency in principle. More specifically, excitons formed by carrier recombination comprise singlet excitons and triplet excitons in a probability ratio of 1:3. Conventional organic EL devices have utilized fluorescence emitted by transition from a singlet exciton to the ground state as available luminescence, but the luminescence efficiency thereof is limited to at most ca. 25% of generated excitons in principle. On the other hand, if phosphorescence of excitons generated from triplets is utilized, an efficiency of at least three times is expected, and even an efficiency of 100%, i.e., four times, can be expected in principle, if a transition owing to inter-system crossing between singlet and triplet states is taken into account.

Devices utilizing luminescence from triplet states are also proposed in JP-A 11-329739 (entitled "Organic EL Device and Process for Production Thereof"), JP-A 11-256148 (entitled "Luminescence Material and Organic EL Device Using Same"), and JP-A 8-319482 (entitled "Organic Electroluminescence Device", corresponding to U.S. Pat. Nos. 5,698,858 and 5,756,224).

In the case where the luminescence layer comprises a host material having a carrier-transporting function and a phosphorescent guest material, a process of phosphorescence attributable to triplet excitons may include unit processes as follows:

(1) transportation of electrons and holes within a luminescence layer,
(2) formation of host excitons,
(3) excitation energy transfer between host molecules,
(4) excitation energy transfer between the host to the guest,
(5) formation of guest triplet excitons, and
(5) phosphorescence.

Energy transfer in each unit process is caused by competition between various energy transfer and deactivation processes. For example, a host exciton, even if formed, can lose its energy by nonradiative deactivation prior to energy transfer to another host. Also in the process of energy transfer from the host to the guest, a host-guest exciplex, when formed, can provide a deactivation process, thus failing to cause luminescence in some cases. Accordingly, the selection of a host material determining an environmental condition surrounding a phosphorescent material is an important point for achieving an increased luminescence efficiency.

SUMMARY OF THE INVENTION

In view of the above-mentioned state of the prior art, a principal object of the present invention is to provide a luminescence device showing a higher luminescence efficiency.

According to the present invention, there is provided a luminescence device comprising a pair of electrodes and at least one organic compound layer including an organic compound layer comprising a mixture of a liquid crystal compound and a phosphorescent compound.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
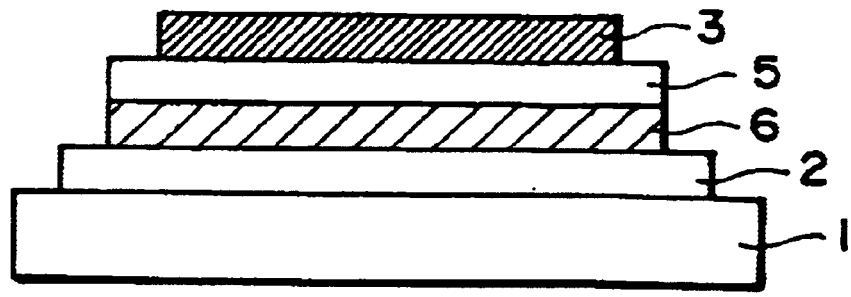
FIGS. 1 to 4 are schematic sectional views each showing a basic structure of an organic EL device.
Figure 2:
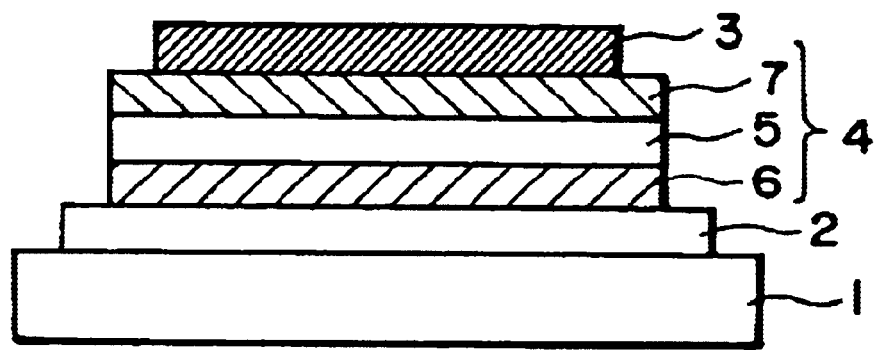

The luminescence device of the present invention is especially characterized by a luminescence layer comprising a host material and a phosphorescent guest material, wherein the host material comprises a liquid crystal compound. The liquid crystal compound used in the present invention is a material having an electronic carrier-transporting function, which has been expected in recent years to provide an electron-transporting layer or a luminescence layer showing high carrier-injection ability and high carrier-transporting ability. Herein, the electronic carrier-transporting function means an ability of moving electronic carriers, such as holes and electrons. As such a liquid crystal compound having a high carrier-transporting function, it is possible to use a liquid crystal compound assuming a discotic phase or a smectic phase exhibiting a high degree of order.

Examples of such a liquid crystal assuming a discotic liquid crystal, i.e., a discotic liquid crystal, may include triphenylene-type liquid crystal compounds having structures as shown below (e.g., as disclosed in Advanced Materials, 1996.8, No. 10).

LC Compounds 1 to 5

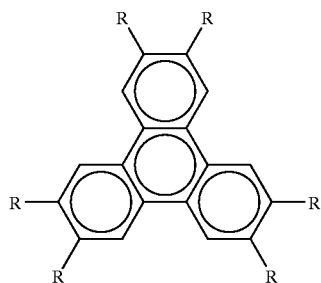

LC Compound 1 R = —SC$_6$H$_{13}$
LC Compound 2 R = —OC$_4$H$_9$
LC Compound 3 R = —OC$_5$H$_{11}$
LC Compound 4 R = —OC$_6$H$_{13}$
LC Compound 5 R = —OC$_4$H$_8$C$_2$F$_5$ LC Compound 6

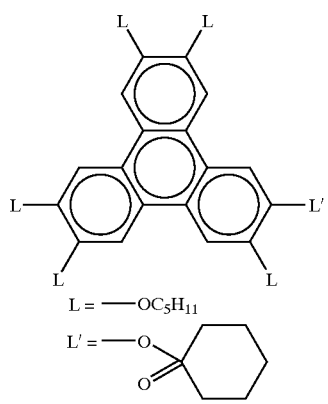

L = —OC$_5$H$_{11}$

L′ = —O\<cyclohexanone\>

LC Compound 7

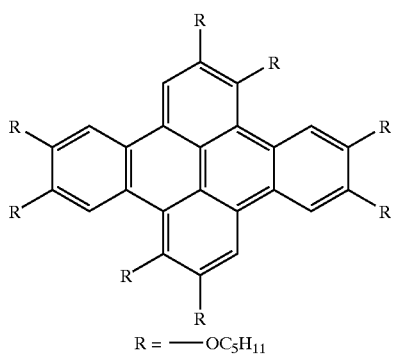

R = —OC$_5$H$_{11}$

The above indicated LC Compounds 1–4 having side chains or substituents R of alkoxy groups —OC$_4$H$_9$, —OC$_5$H$_{11}$ and —OC$_6$H$_{13}$ and a thio-ether group —SC$_6$H$_{13}$ are known to exhibit a hole-transporting performance at a high carrier mobility (on the order of $10^{-1}$–$10^{-3}$ cm/Vs). These compounds exhibit a discotic columnar phase wherein disk-shaped liquid crystal molecules are aligned to form a columnar shape so that their triphenylene skeletons rich in π-electrons are mutually superposed, thus exhibiting a good hole-transporting characteristic via the triphenylene group. LC Compound 5 shown above was developed by our research group and, because of polyfluorinated side chains, exhibits a discotic liquid crystal phase range shifted to a lower temperature side and a lower ionization potential than the corresponding non-fluorinated compound. LC compound 7 has a dibenzopyrene skeleton and also exhibits a discotic columnar phase.

Other discotic liquid crystals may include those having skeletons of phthalocyanine derivatives, naphthalocyanine derivatives, truxene derivatives, hexabenzocolonene derivatives and benzoquinone derivatives.

Representative smectic liquid crystal materials may include those represented by the following structural formulae (as disclosed by Ohyou Butsuri, Appl. Phys., vol. 68, no. 1, p. 26 (1999)).

LC Compound 8

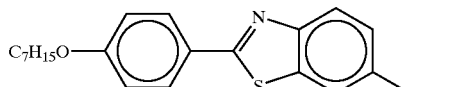

LC Compound 9

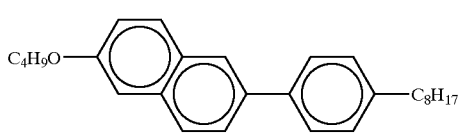

LC Compound 10

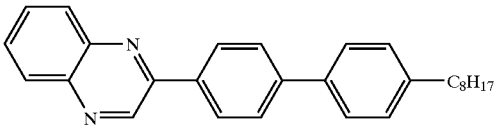

LC Compound 11

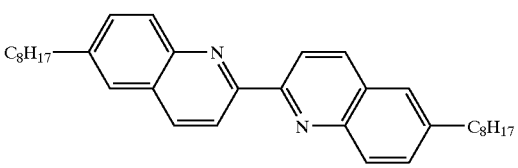

LC Compound 8 shown above, classified as a phenylbenzothiazole derivative and showing smectic A phase, has a hole-transporting characteristic. LC Compound 9, classified as a phenylnaphthalene derivative, shows smectic A phase and smectic E phase and a higher mobility in the smectic E phase of a higher order than the smectic A phase; LC Compound 9 also exhibits bipolar carrier (i.e., hole and electron)-transporting characteristic. All the liquid crystal compounds shown above exhibit a high mobility of $10^{-3}$ cm/V.s or higher.

Other liquid crystal compounds having a bar-shaped skeleton and showing a smectic liquid crystal phase may also be used.

It is preferred that the luminescence device of the present invention is used in a temperature range where the luminescence layer comprising a liquid crystal compound and a phosphorescent compound assumes a liquid crystal phase.

As specific examples of phosphorescent compounds used as a guest material for constituting the luminescence layer, it is possible to preferably use PtOEP or Ir(ppy)$_3$ as described hereinbefore, and it is particularly preferred to use a compound having a planar molecular skeleton like PtOEP. Such a phosphorescent compound, when used in mixture with a liquid crystal compound to form a luminescence layer, can provide a luminescence device having a high luminescence efficiency. The organic layer structure in the luminescence device can preferably assume any one of those shown in FIGS. 1 to 4.

Now, the function of the liquid crystal compound used will be described in detail.

An amorphous material generally used in an organic EL device passes a current with carrier injection as a rate-controlling step. In contrast thereto, if a carrier injection layer comprising a liquid crystal compound is formed in contact with an electrode, the carrier injection-controlling state is alleviated, and a bulk-controlling current is flowed reflecting the bulk characteristic. This is presumably because a liquid crystal compound has a π-electron-conjugated plane close to a planar structure and the π-electron-conjugated plane is aligned parallel to the electrode surface to enhance the interaction with the electrode and promotes the carrier injection in contrast with an amorphous material which generally has a massive structure so that a π-electron-conjugated structure thereof in charge of carrier injection cannot be aligned parallel to the electrode surface.

Accordingly, in the case where a liquid crystal compound is used in a carrier-transporting layer, it becomes possible to utilize the carrier transporting performance reflecting directly the bulk performance thereof, thus exhibiting a carrier injection performance exceeding that of a known amorphous material.

Figure 4:
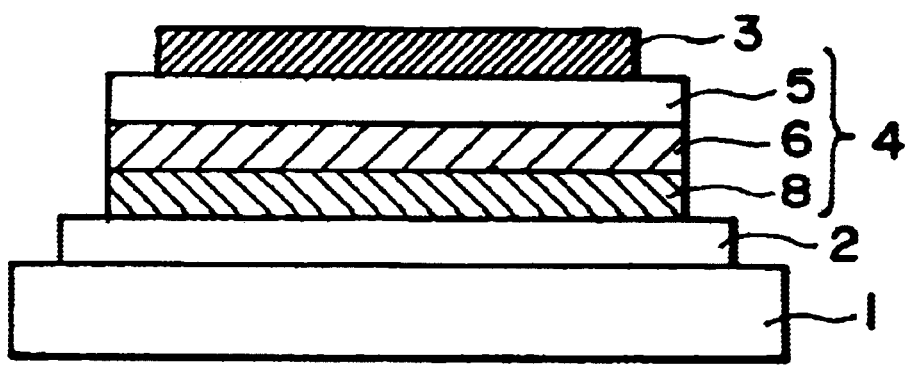

FIG. 4, for example, shows an example of EL device organization, utilizing a liquid crystal compound for improved carrier injection performance proposed by our research group. For example, if a hole-injection layer 8 comprising a triphenylene-based liquid crystal compound is inserted, the hole injection performance from a transparent electrode 2 to an organic layer 4 is improved, thereby providing increased current density and luminescence at an identical applied voltage than in the absence of such a hole-injection layer 8.

Thus, a liquid crystal compound having a carrier-transporting function exhibits, in summary:

[1] a high carrier mobility due to bulk self-alignment, and
[2] a high carrier-injection characteristic due to the alignment of the π-electron-conjugated plane parallel to the electron boundaries, which cannot be exhibited by conventional amorphous materials.

The present invention is characterized by the use of such a liquid crystal compound as a host material of a luminescence layer. No study has been made regarding energy transfer in the above-mentioned unit processes (1)–(6) of the phosphorescence in the case where a liquid crystal compound is used as the host material. As a result of our study, it has been found possible to realize an enhanced luminescence efficiency if a material showing a liquid crystal alignment state is used instead of a material showing an amorphous state, thus arriving at the present invention. The higher luminescence efficiency attained by using a liquid crystal compound in the present invention may be attributable to the following mechanism.

The above-mentioned unit process of (3) excitation energy transfer between host molecules in the entire phosphorescence process is considered. It is important to note the intermolecular energy transfer of triplet excitons strongly contributing to phosphorescence. Compared with a singlet exciton, a triplet exciton has a very long life (of 1 μsec or longer), during which the energy is transferred by migration between molecules. It is believed that the energy transfer by migration is more effectively caused due to effective molecular interaction in a liquid crystal compound having π-electron conjugated planes parallel to the electrode than in an amorphous material including completely random molecular alignment.

On the other hand, in the case of excessively strong inter-molecular interaction, an excited molecule and a ground-state molecule can form an associated molecule (excimer), through which deactivation is caused. A strong molecular interaction is present between planar molecules like skeletons (e.g., triphenylene skeletons) of a liquid crystal compound, so that the deactivation through excimer formation was of some concern but was not serious. This is presumably partly because extensive movement of long alkyl or alkoxy side chains providing a mesomorphism to the liquid crystal compound obstructs such excimer formation.

As a result of our study, it has been also found that energy transfer depends on molecular interaction attributable to intermolecular overlap integral. This is because the mobility of a liquid crystal compound depends on an intermolecular overlap integral so that in the case of using liquid crystal compounds having an identical skeleton, the mobility is believed to reflect the magnitude of overlap integral.

For example, the above-mentioned triphenylene-type liquid crystal compounds showed the following properties indicating that a closer plane distance and a smaller distribution thereof provided an increased π-electron overlap integral to result in a higher mobility.

TABLE 1

| Compound | L.C. Phase *1 | Mobility *2 (cm$^2$/Vs) | Core plane distance *3 (nm) | Luminescence yield ratio *4 (−) |
|---|---|---|---|---|
| LC Compound 2 | Dhc | 1 × 10$^{-2}$ | 0.359 | 1 |
| LC Compound 3 | intermediate of Dhc and Dhd | 3 × 10$^{-3}$ | 0.364 | 0.92 |
| LC Compound 4 | Dhd | 7 × 10$^{-4}$ | 0.368 | 0.82 |

*1: Dhc = discotic hexagonal disordered phase.
    Dhd = discotic hexagonal ordered phase.
*2: Measured by the time-of-flight method at a liquid crystal layer thickness of 15 μm.
*3: Measured by the x-ray diffraction method.
*4: The luminescence yield ratio data are based on values of luminescence intensity (integrated over wavelengths) per unit current density measured based on the structure of Example 3 described hereinafter and using different liquid crystal compounds. The data in Table 1 shows that a higher mobility resulted in a higher luminescence yield.

From the above data, it is understood that a liquid crystal compound exhibits a better performance of energy transfer between host molecules.

Also regarding the phosphorescence unit process of (4) excitation energy transfer between the host and guest, a liquid crystal compound is advantageously used as a host material. Excitation energy transfer between different molecules includes a singlet exciton transfer due to intermolecular bipolar dipole interaction known as Foerster transfer, which is a transfer process possibly occurring between relatively remote molecules. On the other hand, a triplet exciton energy transfer is caused by a Dexter process, as the Foerster transfer is based on spin-forbidden transition. The Dexter process is caused by electron exchange between adjacent molecules and strongly depends on overlapping of molecules. With respect to any guest molecule, a compound having a skeleton of a π-electron planar structure, like a liquid crystal compound, provides a preferred molecular overlap compared with an amorphous molecule, as a host molecule. Further, in the case where a guest luminescence center material has a planar molecular skeleton like PtOEP mentioned above, the guest molecule causes a larger π-electron overlap with such a host molecule like a liquid crystal compound, thus causing effective energy transfer.

Also in this case, the formation of an associated molecule (exciplex) of exciton and a ground-state molecule is involved, but the formation of such a two-molecule associate is suppressed due to the influence of side chains and fluidity of a liquid crystal compound. This has been confirmed by effective energy transfer.

Also, the effect of energy level change of the guest luminescence center under the influence of the host is not negligible. For example, in the case of using Ir(ppy), as a guest luminescence center molecule, $^3$MLCT* (triplet metal to ligand charge transfer excited state) is desired as the lowest triplet excitation state for high efficiency luminescence, but $^3$π-π* can occur in some cases. The energy level of $^3$MLCT* varies depending on the viscosity of the host and becomes lower at a lower host viscosity. Accordingly, in order to stabilize the $^3$MLCT* as the lowest excitation state, it is preferred to use a liquid crystal compound showing a fluidity and a lower viscosity than an amorphous material.

Further, the exciton of a host molecule is required to have a longer exciton life than the guest and is desired to have a stable triplet state. For example, triphenylene forming the skeleton of the above-mentioned triphenylene-type liquid crystal compound is a representative compound exhibiting phosphorescence and has a relatively long triplet life. In this way, it is preferred to use a liquid crystal compound exhibiting phosphorescence.

As described above, a liquid crystal compound is a material which provides an inter-molecular interaction for energy transfer and movement, is less liable to form an excited dimer associate adversely affecting the energy transfer and is suitable for effective triplet energy transfer and movement promoting phosphorescence.

Because of a high luminescence efficiency, the luminescence device of the present invention realizes a higher luminance luminescence or provides an identical luminance at a lower voltage.

EXAMPLE 1

A 70 nm-thick ITO film was formed by sputtering on a glass substrate to provide a transparent electrode. On the other hand, a 100 nm-thick aluminum (Al) film was formed on another glass substrate and patterned to provide metal electrodes. These glass substrates were disposed with their electrodes facing each other and applied to each other with 1 μm-diameter silica beads dispersed therebetween to form a blank cell.

Separately, LC Compound 4 listed above as a triphenyl-type liquid crystal compound was mixed with 5 mol. % of PtOEP (also listed above) as a phosphorescent compound in chloroform, followed by removal by evaporation of the chloroform, to prepare a liquid crystal composition. The liquid crystal composition was injected into the above-prepared cell at its isotropic temperature of 110° C. under a vacuum of $1.3 \times 10^{-2}$ Pa to prepare a luminescence device.

As a result of a microscopic observation, the liquid crystal composition exhibited Dhd phase (discotic hexagonal ordered phase) in a temperature range of ca. 70° C. to ca. 98° C. on temperature increase. The luminescence device was subjected to a voltage application of 120 volts between the transparent electrode (anode) and the metal electrodes (cathode) at 30° C. (below liquid crystal phase temperature) and 70° C. (liquid crystal phase temperature), respectively, whereby red luminescence attributable to PtOEP was confirmed at the respective temperatures. In response to a temperature change from 30° C. to 70° C., the current was increased by 5 times. A luminescence yield ratio (at 30° C./70° C.) of 1:4 was attained based on a definition of luminescence yield=luminance/passed current value, thus exhibiting effective energy transfer by the use of a liquid crystal compound.

EXAMPLE 2

A luminescence device was prepared in the same manner as in Example 1 except LC Compound 9 (also listed above) was used instead of LC Compound 4 and Ir(ppy)$_3$ (also listed above) was used instead of PtOEP to prepare a liquid crystal composition. The liquid crystal composition assumed SmE phase at 66° C., SmA phase at 122° C. and isotropic (Iso) phase at 132° C., respectively, on temperature increase.

The luminescence device was subjected to a voltage application of 100 volts or higher at 30° C. and 70° C. (SmE phase), respectively, whereby green luminescence attributable to Ir(ppy)$_3$ was confirmed at the respective temperatures. The luminescence yield ratio was 1:2.6 (at 30° C./70° C.), thus exhibiting effective energy transfer by the use of a liquid crystal compound.

EXAMPLE 3

Figure 3:
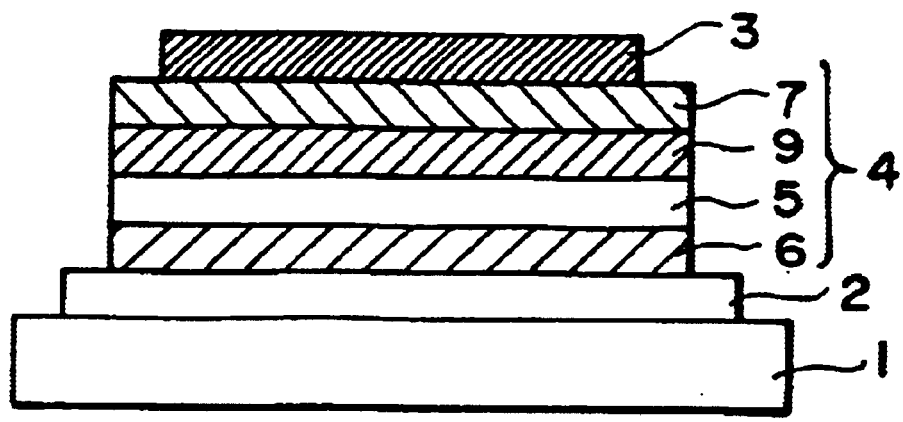

A luminescence device having a laminate structure as shown in FIG. 3 was prepared.

More specifically, a 70 nm-thick ITO film was formed by sputtering on a glass substrate 1 to provide a transparent electrode 2 and, at a vacuum of $1.3 \times 10^{-4}$ Pa on an average, was further subjected to successive vacuum deposition of four organic layers, i.e., a 30 nm-thick hole-transporting layer 6 of α-NPD, a 30 nm-thick luminescence layer 5 of a liquid crystal composition comprising a 95:5 (by volume) mixture of LC Compound 4 and Ir(ppy)$_3$, a 30 nm-thick exciton diffusion-preventing layer 9 of BPC (2,9-dimethyl-4,7'-diphenyl-1,10-phenanthroline) and a 30 nm-thick electron-transporting layer 7 of Alq. The vapor deposition of the organic layers 6, 5, 9 and 7 was performed by placing each organic in an amount of ca. 100 mg on a molybdenum-made boat and by resistance heating to provide a desired vapor deposition rate. For the formation of the luminescence layer 5, LC Compound 4 and Ir(ppy)$_3$ were co-vaporized at film growth rates of 0.15 nm/sec and 0.075 nm/sec., respectively, based on the results of preliminary film growth speed measurements by means of a film thickness meter using a quartz vibrator element.

Above the organic layers, an Al alloy containing 1.8 mol. % of Li was vapor-deposited in a thickness of 10 nm, and then Al metal was vapor-deposited in 150 nm to provide a cathode 3. The inclusion of the Li metal at the cathode boundary promotes electron injection because of a small work function thereof.

The thus-prepared luminescence device was heated to 70° C. (liquid crystal phase temperature of the above-liquid crystal composition) and subjected to a voltage application between the electrodes. As a result, when voltages were applied between the electrodes with the ITO electrode 2 as the anode, a good rectifying characteristic showing a good conductivity was confirmed, and green luminescence attributable to Ir(ppy)₃ was confirmed at a voltage of 5 volts or larger.

Comparative Example 1

A luminescence device was prepared in the same manner as in Example 3 except a composition including hexamethoxytriphenylene having no liquid crystal phase was used instead of LC Compound 4 used in the liquid crystal composition of Example 3. As a result of a voltage application, the resultant device of Comparative Example 1 exhibited a luminescence yield ratio of 1/3 with respect to that of Example 3, thus proving an improved luminescence efficiency when using LC Compound 4 as a host compound in Example 3, as compared to hexamethoxytriphenylene in Comparative Example 1.

EXAMPLE 4

A luminescence device was prepared in the same manner as in Example 1 except Ir(ppy)₃ was used instead of PtOEP. The resultant luminescence device exhibited a luminescence yield (luminance/current) ratio at an identical temperature (70° C.) and voltage (120 volts) of 1/0.8 with respect to the device of Example 1, thus showing a higher luminescence yield in this Example 4. However, with respect to a total luminescence intensity (integral of luminescence intensity over spectral wavelengths), the device of Example 1 exhibited 4 times as large as that of the device of Example 4. The difference is because the above-mentioned luminescence yield value is based on "luminance" depending on human visual sensitivity which is 5 times as large at 510 nm (luminescence wavelength of Ir(ppy)₃) as at 650 nm (luminescence wavelength of PtOEP), so that the above result rather means that the device of Example 1 showed a higher efficiency of conversion to photo-energy, thus showing a better energy transfer caused by PtOEP having a planar molecular skeleton as a host compound.

As described above, the present invention provides a luminescence device showing a higher luminescence efficiency, which is applicable to a product requiring energy economization or higher luninance. More specifically, the luminescence device is applicable to a display apparatus, an illumination apparatus, a printer light source or a backlight for a liquid crystal display apparatus. As for a display apparatus, it allows a flat panel display which is light in weight and provides a highly recognizable display at a low energy consumption. As a printer light source, the luminescence device of the present invention can be used instead of a laser light source of a laser beam printer and may be disposed in an independently addressable matrix arrangement to effect desired exposure on a photosensitive drum for image formation. The use of the luminescence device of the present invention is effective for providing such an illumination device or a backlight at a remarkably reduced apparatus volume and a minimal energy consumption.

What is claimed is:

1. A luminescence device comprising:

a pair of electrodes, and at least one organic compound layer including an organic compound layer comprising a mixture of (a) a liquid crystal compound having an electronic carrier-transporting function and a phosphorescent function and (b) an organic phosphorescent compound, wherein said organic phosphorescent compound is an organic metal coordination compound having a heavy metal as a central metal, and wherein phosphorescence attributable to said organic phosphorescent compound is produced by passing a current between the pair of electrodes.

2. The luminescence device according to claim 1, wherein the liquid crystal compound is a compound assuming a smectic phase.

3. The luminescence device according to claim 1, wherein the liquid crystal compound is a compound assuming a discotic phase.

4. The luminescence device according to claim 1, wherein the organic phosphorescent compound has a planar molecular skeleton.

5. A luminescence device comprising:

a pair of electrodes, and at least one organic compound layer including an organic compound layer comprising a mixture of (a) a liquid crystal, as a host material, having a carrier-transporting function and a phosphorescent function and (b) an organic phosphorescent compound as a guest material, wherein said organic phosphorescent compound is an organic metal coordination compound having a heavy metal as a central metal, and wherein phosphorescence attributable to said organic phosphorescent compound is produced by passing a current between the pair of electrodes.

6. The device according to claim 1, wherein the liquid crystal compound is a triphenylene compound having a phosphorescent function.

7. The device according to claim 5, wherein the liquid crystal compound is a triphenylene compound having a phosphorescent function.

* * * * *

UNITED STATES PATENT AND TRADEMARK OFFICE
CERTIFICATE OF CORRECTION

PATENT NO. : 6,897,913 B2  
APPLICATION NO. : 09/904505  
DATED : May 24, 2005  
INVENTOR(S) : Akira Tsuboyama et al.

Page 1 of 1

It is certified that error appears in the above-identified patent and that said Letters Patent is hereby corrected as shown below:

On Title Page Item (56) col. 2

References Cited

OTHER PUBLICATIONS

After Communications, European, "Pattern" should read --Patent--.

Column 1

Line 23, "hoteltransporting" should read --hole-transporting--.

Column 6

Line 3, "$10^{31}$ $^{1}$-$10^{-3}$ cm/Vs)." should read --$10^{-1}$ - $10^{-3}$ cm/Vs).--

Column 11

Line 52, "luninance." should read -- luminance.--.

Signed and Sealed this

Fifth Day of September, 2006

JON W. DUDAS  
*Director of the United States Patent and Trademark Office*